United States Patent
O'Riordan et al.

(10) Patent No.: US 10,223,484 B1
(45) Date of Patent: Mar. 5, 2019

(54) SPICE MODEL BIN INHERITANCE MECHANISM

(71) Applicant: Cadence Design Systems, Inc., San Jose, CA (US)

(72) Inventors: Donald J. O'Riordan, Sunnyvale, CA (US); Richard J. O'Donovan, San Jose, CA (US); Saibal Saha, Cupertino, CA (US); Jushan Xie, Pleasaanton, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 1050 days.

(21) Appl. No.: 14/231,497

(22) Filed: Mar. 31, 2014

(51) Int. Cl.
*G05B 23/02* (2006.01)
*G06F 17/50* (2006.01)

(52) U.S. Cl.
CPC .............. *G06F 17/5036* (2013.01)

(58) Field of Classification Search
CPC ............ G06F 17/5036; G06F 17/5045; G06F 17/505; G06F 17/5068; G06F 17/5022; G06F 17/5031; G06F 17/5072; G06F 17/5077; G06F 2217/78; G01R 27/28; G01R 31/2846; Y10S 707/99937
USPC .......................................................... 703/14
See application file for complete search history.

(56) References Cited

U.S. PATENT DOCUMENTS

| | | | | |
|---|---|---|---|---|
| 7,263,477 B2* | 8/2007 | Chen | ................... | G06F 17/5036 700/31 |
| 8,667,436 B1* | 3/2014 | Garlapati | ............ | G06F 17/5045 703/15 |
| 8,694,302 B1* | 4/2014 | Ho | ..................... | G06F 17/5036 703/13 |
| 2005/0086033 A1* | 4/2005 | Chen | ..................... | G01R 27/28 703/2 |
| 2011/0040548 A1* | 2/2011 | Khalily | ............... | G06F 17/5036 703/14 |

OTHER PUBLICATIONS

Whether_Defined (Whether Defined, Websters New World, 1971).*
Morse_2012 (Interoperable Design Constraints for Customer IC Design, IEEE CEDIA, Mar./Apr. 2012.).*
PDK_Defined_2012 (Archived Wiki page dated Sep. 1, 2012 downloaded from https://en.wikipedia.org/w/index.php?title=Process_design_kit&oldid=510240323 ).*
Name_Resolution_Defined_2012_Wiki (Archived Wiki page dated Mar. 7, 2013 downloaded from htlpsJ/en.wikipedia.ag/w/index.ptl)?title=N ameJesolution&cldd=54255B685).*

(Continued)

*Primary Examiner* — Brian S Cook
(74) *Attorney, Agent, or Firm* — Hunton Andrews Kurth LLP

(57) ABSTRACT

A system, method, and computer program product for facilitating model binning in circuit simulators. Embodiments enable specification of models spanning binning dimensions, such as device width and length, in a model group via inheritable model bins. New simulator modeling syntax and semantics eliminate much of the redundancy and parsing overhead from model parameter specifications in foundry process design kits. Indirect and optional inheritance is also enabled, allowing for fine grain and coarse grain grids in the same model group.

20 Claims, 18 Drawing Sheets

(56) References Cited

OTHER PUBLICATIONS

Netlist_Defined_2012_Wiki (Archived Wiki page dated Jan. 25, 2013 downloaded from https://en.wikipedia.org/w/index.php?title=Netlist&oldid=534791962 ).*
Siddhi_2006 (Recursion Part 2: Tail Recursion, Accumulators and Iteration, dated Thursday, Apr. 13, 2006. Downloaded from http://www.siddhcrta.me/2006I04/recursion-pert-2-tail-recursion.html).*
Binning_1997 (Automated Model Binning, The Simulation Standard, Jan. 1997).*
Savitch_2001 (Inheritance in Java Walter Savith, Apr. 19, 2002).*
Bourbakis_1991 (Applications of Learning and Planning Methods, World Scientific Publishing Co. Pte. Ltd., 1991).*
IC_CAP_2008 (Agilent 85190A IC-CAP 2008, Nonlinear Device Models vol. 1, Mar. 2008 Agilent Technologies Inc.).*
Davis_2001 (PTOLEMY II, Heterogeneous Concurrent Modeling and Design in Java, Memorandum UCB/ERL M99/40 Document Version 1.0, Mar. 15, 2001.).*
Savitch_2002 (Inheritance in Java, by Walter Savitch, Apr. 19, 2002).*
Tutorial_HSPICE_2012 (Tutorial: Analog Artist with HSPICE—NCSU EDU Wiki, archived Nov. 22, 2012 downloaded from waybackmachine.org).*
Nystrom_2004 (Scalable Extensibility via Nested Inheritance, OOPSLA'04, Oct. 24-28, 2004).*

* cited by examiner

200

```
model pch_simple mos2 {

1:type=p vto=-0.65 gamma=0.47 lambda=0.09 \
        ld=0.45E-6 kp=0.33E-4 tox=0.21E-7 is=0.0 \
        lmin=0.5u lmax=1.5u wmin=1u wmax=3u \
        tnom=25 xl=3e-08 af=0.8824

2:type=p vto=-0.69 gamma=0.44 lambda=0.09 \
        ld=0.45E-6 kp=0.33E-4 tox=0.21E-7 is=0.0 \
        lmin=1.5u lmax=2.5u wmin=1u wmax=3u 3:type=p vto=-0.73 gamma=0.37 lambda=0.09 \
        ld=0.45E-6 kp=0.33E-4 tox=0.21E-7 is=0.0
        lmin=0.5u lmax=1.5u wmin=1u wmax=3u 4:type=p vto=-0.77 gamma=0.34 lambda=0.09 \
        ld=0.45E-6 kp=0.33E-4 tox=0.21E-7 is=0.0 \
        lmin=3.5u lmax=5u wmin=3u wmax=5u

```
// A base model, which defines common parameter values/expressions that
// apply across all bins
model base extends bsim3v3 {
    p1=value1 p2=value2 ... p250=value250
}

// A length-based model group, which inherits all base parameter expressions, and
// additionally defines parameter values that are fixed within any given length range
model pch_len extends base {
    // specify n constant values for each of the 4 length bins
    l1: lmin=0.5u lmax=1.5u pl1=value1 pl2=value2 ... pln=valuen
    l2: lmin=1.5u lmax=2.5u pl1=value1 pl2=value2 ... pln=valuen
    l3: lmin=2.5u lmax=3.5u pl1=value1 pl2=value2 ... pln=valuen
    l4: lmin=3.5u lmax=4.0u pl1=value1 pl2=value2 ... pln=valuen
}

// The final length and width based model group, which extends the pch_len
// length-based group (i.e. all the constant parameter expressions and those that
// are fixed for any given length range), and then additionally specifies the
// width-dependent values/expressions
model pch extends pch_len {
    // inheritance keyword implies inherit everything for a1, a2 from pch_len.l1
    // ...additionally specify m constant values for each of the 2 width bins
    a1 extends l1: wmin=1u wmax=3u pw1=value1 pw2=value2 ... pwm=valuem
    a2 extends l1: wmin=3u wmax=5u pw1=value1 pw2=value2 ... pwm=valuem // a3, a4 inherit everything from pch_len.l2
    a3 extends l2: wmin=1u wmax=3u pw1=value1 pw2=value2 ... pwm=valuem
    a4 extends l2: wmin=3u wmax=5u pw1=value1 pw2=value2 ... pwm=valuem // a5, a6 inherit everything from pch_len.3
    a5 extends l3: wmin=1u wmax=3u pw1=value1 pw2=value2 ... pwm=valuem
    a6 extends l3: wmin=3u wmax=5u pw1=value1 pw2=value2 ... pwm=valuem // a7, a8 inherit everything from pch_len.3
    a7 extends l4: wmin=1u wmax=3u pw1=value1 pw2=value2 ... pwm=valuem
    a8 extends l4: wmin=3u wmax=5u pw1=value1 pw2=value2 ... pwm=valuem
}
``` base
- pch_len.l1 (inherited from base)
  - pch.a1 (inherited from pch_len.l1)
  - pch.a2 (inherited from pch_len.l1)
- pch_len.l2 (inherited from base)
  - pch.a3 (inherited from pch_len.l2)
  - pch.a4 (inherited from pch_len.l2)
- pch_len.l3 (inherited from base)
  - pch.a5 (inherited from pch_len.l3)
  - pch.a6 (inherited from pch_len.l3)
- pch_len.l4 (inherited from base)
  - pch.a7 (inherited from pch_len.l4)
  - pch.a8 (inherited from pch_len.l4)

FIG. 4A

```
// A base model, which defines common parameter values/expressions that
// apply across all bins
model base extends bsim3v3 {
    p1=value1 p2=value2 ... p250=value250
}

// A length-based model group, which inherits all base parameter expressions, and
// additionally defines parameter values which are fixed within any given length range
model pch_width extends base {
    // specify m constant values for each of the 2 width bins
    w1: wmin=1u wmax=3u pw1=value1 pw2=value2 ... pwm=valuem
    w2: wmin=3u wmax=5u pw1=value1 pw2=value2 ... pwm=valuem
}

// The final length and width based model group, which inherits from the pch_width
// width-based group (i.e. all the constant parameter expressions and those that
// are fixed for any given width range), and then additionally specifies the
// length-dependent values/expressions
model pch extends pch_width {

// b1...b4 inherit everything from pch_width.w1
    // ...additionally specify m constant values for each of the 4 length bins
    b1 extends w1: lmin=0.5u lmax=1.5u pl1=value1 pl2=value2 ... pln=valuen
    b2 extends w1: lmin=1.5u lmax=2.5u pl1=value1 pl2=value2 ... pln=valuen
    b3 extends w1: lmin=2.5u lmax=3.5u pl1=value1 pl2=value2 ... pln=valuen
    b4 extends w1: lmin=3.5u lmax=4.0u pl1=value1 pl2=value2 ... pln=valuen // b5...b8 inherit everything from pch_width.w2
    // ...additionally specify m constant values for each of the 4 length bins
    b5 extends w2: lmin=0.5u lmax=1.5u pl1=value1 pl2=value2 ... pln=valuen
    b6 extends w2: lmin=1.5u lmax=2.5u pl1=value1 pl2=value2 ... pln=valuen
    b7 extends w2: lmin=2.5u lmax=3.5u pl1=value1 pl2=value2 ... pln=valuen
    b8 extends w2: lmin=3.5u lmax=4.0u pl1=value1 pl2=value2 ... pln=valuen
}
```

FIG. 5

```
// A base model, which defines common parameter values/expressions that
// apply across all bins
model base extends bsim3v3 {
    p1=value1 p2=value2 ... p250=value250
}

// A length-based model group, which inherits all base parameter expressions, and
// additionally defines parameter values which are fixed within any given length range
model pch_len extends base {
    // specify n constant values for each of the 4 length bins
    l1: lmin=0.5u lmax=1.5u pl1=value1 pl2=value2 ... pln=valuen
    l2: lmin=1.5u lmax=2.5u pl1=value1 pl2=value2 ... pln=valuen
} model illegal1 extends pch_len {
    // l1 is illegal here, since it also exists in parent bin pch_len.l1
    l1: lmin=2.5u lmax=3.5u pl1=value1 pl2=value2 ... pln=valuen  // illegal use of l1!
    l4: lmin=3.5u lmax=4u pl1=value1 pl2=value2 ... pln=valuen
}
```

FIG. 6A

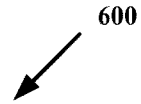

```
// A base model, which defines common parameter values/expressions that
// apply across all bins
model base extends bsim3v3 {
    p1=value1 p2=value2 ... p250=value250
}

// A length-based model group, which inherits all base parameter expressions, and
// additionally defines parameter values which are fixed within any given length range
model pch_len extends base {
    // specify n constant values for each of the 4 length bins
    l1: lmin=0.5u lmax=1.5u pl1=value1 pl2=value2 ... pln=valuen
    l2: lmin=1.5u lmax=2.5u pl1=value1 pl2=value2 ... pln=valuen
} model pch_len2 extends pch_len {
    // specify n constant values for each of the 4 length bins
    l3: lmin=2.5u lmax=3.5u pl1=value1 pl2=value2 ... pln=valuen
    l4: lmin=3.5u lmax=4u pl1=value1 pl2=value2 ... pln=valuen
} model pch extends pch_len2 {
    // l1 is inherited from grandparent pch_len, not from immediate parent pch_len2
    g6 extends l1 : wmin=1u wmax=3u pw1=value1 pw2=value2 ... pwm=valuem // l3 is inherited from from immediate parent pch_len2
    p1 extends l3 : wmin=1u wmax=3u pw1=value1 pw2=value2 ... pwm=valuem
}
``` base
- pch_len.l1 (inherited from base)
  - pch.g6 (inherited from pch_len.l1)
- pch_len.l2 (inherited from base)
- pch_len2.l3 (inherited from pch_len)
  - pch.p1 (inherited from pch_len2.l3)
- pch_len2.l4 (inherited from pch_len)

```
// A base model, which defines common parameter values/expressions that
// apply across all bins
model base extends bsim3v3 {
    p1=value1 p2=value2 ... p250=value250
}

// A length-based model group, which inherits all base parameter expressions, and
// additionally defines parameter values which are fixed within any given length range
model pch_len extends base {
    // specify n constant values for each of the 4 length bins
    l1: lmin=0.5u lmax=1.5u pl1=value1 pl2=value2 ... pln=valuen
    l2: lmin=1.5u lmax=2.5u pl1=value1 pl2=value2 ... pln=valuen
    l3: lmin=2.5u lmax=3.5u pl1=value1 pl2=value2 ... pln=valuen
    l4: lmin=3.5u lmax=4u pl1=value1 pl2=value2 ... pln=valuen
}

// The final length and width based model group, which inherits from the pch_len
// length-based group (i.e. all the constant parameter expressions and those that are
// fixed for any given length range), and then additionally specifies the width-dependent
// values/expressions
model pch_merged extends pch_len {

// extend (i.e., inherit everything from) pch_len.l1 ...
    // ...additionally specify m constant values for each of the 2 width bins
    c1 extends l1: wmin=1u wmax=3u pw1=value1 pw2=value2 ... pwm=valuem
    c2 extends l1: wmin=3u wmax=5u pw1=value1 pw2=value2 ... pwm=valuem // extend/inherit everything from pch_len.l2
    c3 extends l2: wmin=1u wmax=3u pw1=value1 pw2=value2 ... pwm=valuem
    c4 extends l2: wmin=3u wmax=5u pw1=value1 pw2=value2 ... pwm=valuem // Two 'merged' cells, which accommodate ranges l3 union l4
    // i.e. lmin=2.5u to lmax=4u. No bin-inheritance in this case as it is likely
    // there are different pl1, pl2...pln values compared to what was in the
    // superclass l3, l4 cases
    c5: lmin=2.5u lmax=4.0u wmin=1u wmax=3u \
            pl1=value1 pl2=value2 ... pln=valuen \
            pw1=value1 pw2=value2 ... pwm=valuem c6: lmin=2.5u lmax=4.0u wmin=3u wmax=5u \
            pl1=value1 pl2=value2 ... pln=valuen \
            pw1=value1 pw2=value2 ... pwm=valuem
}
```

702 base
- pch_len.l1 (inherited from base)
  - pch_merged.c1 (inherited from pch_len.l1)
  - pch_merged.c2 (inherited from pch_len.l1)
- pch_len.l2 (inherited from base)
  - pch_merged.c3 (inherited from pch_len.l2)
  - pch_merged.c4 (inherited from pch_len.l2)
- pch_merged.c5
- pch_merged.c6

SPICE MODEL BIN INHERITANCE MECHANISM

BACKGROUND

The present invention relates to the field of circuit simulation, and more precisely to enabling circuit designers to more easily manage model binning.

Circuit designers frequently use devices of different geometries, e.g., length values and width values, in their circuit designs. Device model equations in a SPICE-like simulator describe electrical device behavior using model parameter values that may depend on device geometries and fabrication processes. It is not always possible to adequately describe the behavior of all devices in a design with a single model statement, e.g., a single set of model parameters.

Modeling engineers may instead use a set of simulator model statements that are each deemed valid for a specific process over a specific range of device geometries. Each span of device width and length, for example, for which a particular model is accurate may be termed a "bin". "Binning" in the field of SPICE modeling and simulation therefore may refer to the process of partitioning a device description into a model group that encompasses different size ranges of design interest. Binning may further include the process of generating and managing these models.

It has become common in the circuit design industry for integrated circuit foundries or others to provide process design kits to circuit designers. A process design kit may include many sets of model parameter values and/or expressions that may be evaluated to determine model parameter values for each corresponding bin. Such expressions may be formulated in terms of process-specific and/or geometry-specific variables. Process design kit suppliers thus characterize devices using model groups to improve overall model fitting accuracy for circuit designers.

In FIG. 1, a group of geometry-related partitions 100 is shown for various length and width ranges (which are not drawn to scale). In this example, a device may have a length (L) between 0.25 µm to 100 µm and a width (W) between 0.25 µm to 100 µm. A modeling engineer or process design kit provider may divide the description of electrical device behavior into multiple bins as shown. In this example, nine models are used (MODEL1 through MODEL9), with one model used per bin. For devices with length values between 1 µm and 10 µm and width values between 10 µm and 100 µm, the MODEL2 bin may be used, etc. In one exemplary commercially available simulator, the bin names (e.g., "MODEL2") within a model group may be strings as well as numbers.

Some simulators provide an automatic model selection feature that automatically assigns the correct simulator models to devices according to particular device sizes. This feature may simplify the management of model groups. Model selection is automatic for MOSFET models (e.g., BSIM1, BSIM2, BSIM3, etc.) in an exemplary commercially available simulator.

This particular simulator may define model groups in a netlist by using curly braces, e.g., "{ ... }", so the automatic model selector may find a specific model in a model group. Every model in the model group may be given a name and the list of its parameters and/or expressions to be evaluated. The device length and width ranges may be specified using the four geometric parameters lmax, lmin, wmax, and wmin for example. The selection criteria to choose a model for a given device instance may be therefore:

$lmin <= instance\_length < lmax$ and
$wmin <= instance\_width < wmax$

For example, when given a netlist comprising a model group definition and a device instance, the simulator may search through the models in the model group and pick the first model whose geometric range satisfies the selection criteria corresponding to the device instance. The corresponding model parameters are then used during simulation.

In FIG. 2, an exemplary MOS model group 200 is shown. Here each of four bin models (pch_simple.1 through pch_simple.4) comprises many model parameter values, provided in this case over multiple netlist lines. For the following device instances:

M0 (nd ng ns nb) pch_simple m=1.0 w=2.5u l=2u
M1 (pd pg ps pb) pch_simple m=1.0 w=4u l=4u the simulator's automatic model selector selects bin pch_simple.2 for transistor M0 and bin pch_simple.4 for transistor M1 after searching for a bin model meeting the selection criteria. (Note, in this simulator "u" unit notation denotes micrometers.)

For today's small geometry processes, each individual transistor bin model may contain hundreds of parameters. Further, model groups may have forty or more bins, compared to the mere nine shown in FIG. 1. Model parameter expressions may also be quite complex and may depend on additional parameters, such as those relating to fabrication processes. Multiple models may be needed for different device polarities (e.g., NMOS and PMOS), different voltage device capabilities (e.g., low, medium, and high voltage), different leakage current versions (e.g., low and high leakage), and various other factors. Each of these selection dimensions is multiplicative on the overall model count, and therefore the simulator's model selection task may be both slow and memory intensive.

Accordingly, the inventors have developed a novel way to facilitate model binning to more easily manage model information for circuit simulation.

BRIEF DESCRIPTION OF THE DRAWINGS

FIG. 3A is a diagram of a model hierarchy, with length-dependent parameters as the middle level, according to an embodiment.

FIG. 5 is a diagram of an illegal re-definition of a bin across a model hierarchy, according to an embodiment.

FIG. 6A is a diagram of an additional model hierarchy with indirect inheritance, according to an embodiment.

FIG. 7A is a diagram of a further model hierarchy with optional inheritance, according to an embodiment.

DETAILED DESCRIPTION

Figure 1:
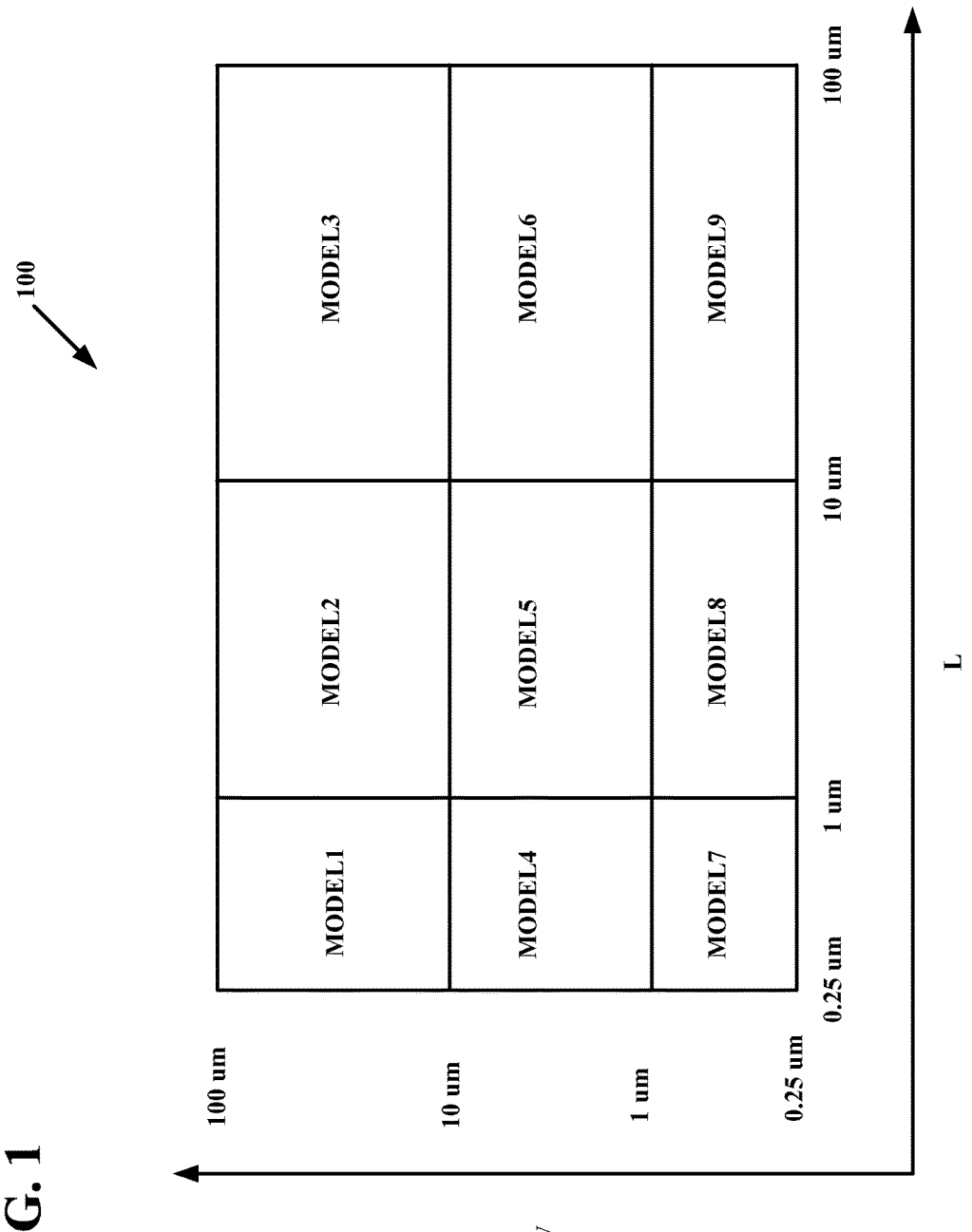
FIG. 1 is a diagram of a group of geometry-related partitions for various length and width ranges.

This description presents a new system, method, and computer program product for facilitating model binning in circuit simulators. Embodiments enable specification of models spanning binning dimensions, such as device width and length, in a model group via inheritable bin models. New simulator modeling syntax and semantics eliminate much of the redundancy and parsing overhead from model parameter specifications in foundry process design kits. Indirect and optional inheritance is also enabled, allowing for fine grain and coarse grain grids in the same model group.

Redundancy in Model Groups

When inspecting the process design kit for one particular foundry, the inventors noted for a typical device that the geometry was gridded into twenty-four bins. The grid was a standard table with rows and columns, and with no bins combined. Many of the model parameter values were found to be identical, e.g., they either contained the same numeric value or the same expression, across one or more of the bins. The inventors further noted that of the approximately 350 model parameters per model in the model group, approximately seventy percent of these model parameters had values (numbers or expressions) that were the same across all bin models.

Of the remaining thirty percent of the total model parameters, the inventors found that approximately one third were width-independent, e.g., each had the same value across all bin models having the same [lmin, lmax] values. In other words, approximately thirty length-dependent model parameters had values that were constant within a given length range, regardless of width range. Only the remaining approximately seventy (e.g., twenty percent of the total) width- and length-dependent model parameters actually varied uniquely across all the bins.

These results are not unusual. Process design kits often contain such redundancies, as not every model parameter may have been extracted for a given model dimension. Even the extremely simple model group of FIG. 2 exhibits such redundant traits, with only the vto and gamma model parameters actually varying, and all other model parameters (excluding the geometry range parameters themselves, e.g., lmin, lmax, wmin, wmax) being constant.

The embodiments of the present invention therefore exploit this regularity by introducing new syntax and associated semantics to enable simulator model groups to be specified hierarchically, using a new bin-aware inheritance concept. The new syntax allows for a "base" device model to be specified, in which for example the common parameter expressions may be listed just once. This base model may have no bins.

A length-based model group may be derived from the base model. That is, a length-based model may be specified that "extends" the base model, in which the length bins are specified, but no width bins are specified. The base parameters may be automatically inherited from the base model. For each length bin, the width-independent parameters (with fixed parameter values/expressions) within that length range may be specified.

The final width- and length-based model group may be derived from the length-based model group, in which the width bins may be specified. The width bins may be further specified to extend (e.g., inherit from or subclass) the length bins from the length-based model group to achieve further compaction.

Hierarchical Model Groups with Inheritance

FIG. 3A shows a model group inheritance hierarchy 300 with a base level, a length-based middle level, and individual extensions by width, according to an embodiment. The model performing the extension (also known as inheritance) is known as the submodel, and the model being extended (e.g., inherited from) is known as the supermodel. In this example, model pch_len is a (direct) submodel of model base. Model base is the supermodel of model pch_len. Likewise, model pch is a (direct) submodel of model pch_len, and model pch_len is the (direct) supermodel of model pch. In addition to the concept of model inheritance, this description provides a related but separate concept of model bin inheritance. A subbin such as a1 inherits from a superbin, such that l1 is the superbin of bin a1. (In this description, terms "model" and "model group" are synonymous. Terms "bin" and "model bin" are synonymous. Terms "subclasses", "inherits from" and "extends" are synonymous.) In FIG. 3A, eight leaf-level model bins (a1, . . . , a8) are specified (four length-dependent bins, times two width-dependent bins), using three levels of model hierarchy combined with one level of model bin hierarchy. The model hierarchy described is one where model group pch subclasses model group pch_len, which in turn subclasses model base. Note that when a model or model group extends, e.g., subclasses (e.g., inherits from), a parent model/model group, it automatically inherits all the parameter name+value pairs from the parent model/model group. When a bin inherits from a bin within a parent or ancestor model group, it inherits only the bin parameters (and not the other parameters from the supermodel), according to an embodiment. After applying the binning algorithm, a device of a specific geometry is thus assigned both a model and an optional bin within that model. The device then inherits the union of the model parameters and the (assigned) model bin parameters, according to an embodiment.

Note that when a model or model group extends a base model or model group, the inheritance keyword "extends" may be present, to greatly improve readability by users. For simulator backward compatibility reasons, this inheritance keyword, or others, may be optional. Thus, the following two statements may be considered equivalent:

model pch_len extends base { . . . }
model pch_len base { . . . }

Figures 3B, 3C:
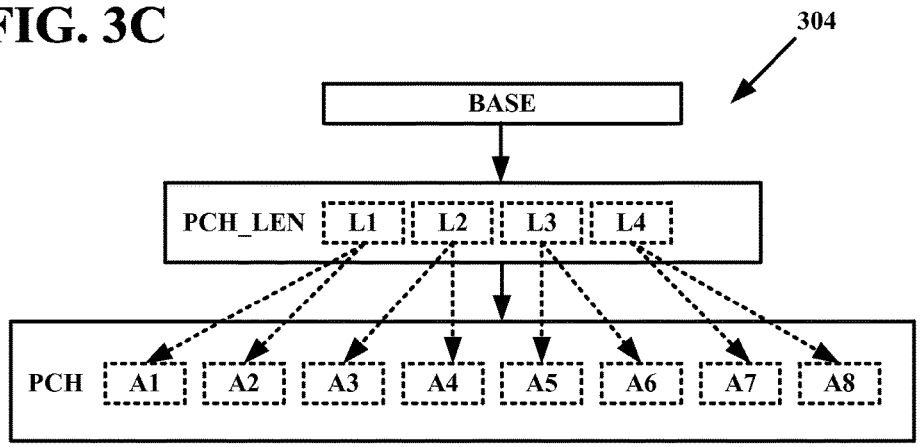
FIG. 3B summarizes the model hierarchy in text form, FIG. 3C summarizes the model hierarchy in graphical form.
Figure 3D:
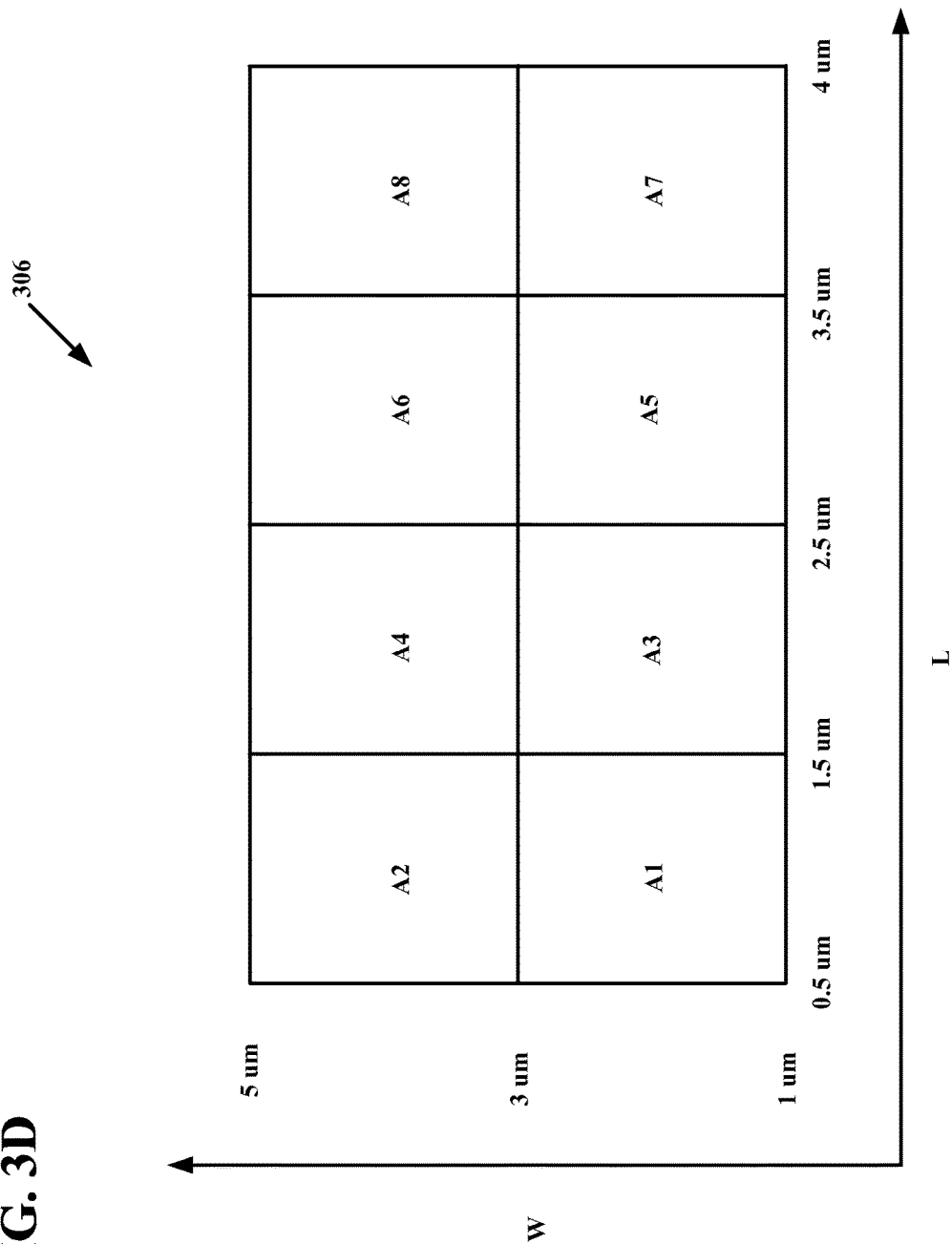
FIG. 3D is a diagram of geometry-related partitions resulting from the model hierarchy.

Within a particular bin specification however, the "extends" keyword or other inheritance keyword may be required to declare the inheritance relationship. In the following examples, the first definition (a5) is legal, but the second definition (a6) is illegal because it omits the inheritance keyword:

a5 extends l3: wmin=1u wmax=3u pw1=value1 pw2=value2 . . . pwm=valuem
a6 l3: wmin=3u wmax=5u pw1=value1 pw2=value2 . . . pwm=valuem In the FIG. 3A example, when the model group hierarchy is fully expanded, there are actually 1+4+8=13 bsim3v3 bin models effectively available. The expanded model group hierarchy 302 is shown in text form in FIG. 3B, and in graphical form 304 in FIG. 3C, according to this embodiment. Model inheritance is shown via solid lines, and model bin inheritance is shown via dashed lines. In addition to the base model, there are eight leaf-level group bins pch.a1 . . . pch.a8, and four intermediate level bins pch_len.11 . . . pch_len.14, as shown. FIG. 3D is a diagram of the geometry-related partitions 306 resulting from the model hierarchy, according to this embodiment.

A transistor instance may be defined to use any of the three models, base, pch_len, or pch:
M1 (d g s b) base w=1u l=0.5u
M2 (d g s b) pch_len w=1u l=1u
M3 (d g s b) pch w=1u l=2u In this example, the simulator's automatic model selection feature may be applied for both M2 and M3. M2 is an instance of model group pch_len (with four available model group bins) and M3 is an instance of model group pch (with eight available model group bins). Each device M2 and M3 then inherits the union of the model group parameters and the (assigned) model bin parameters, according to an embodiment. When the hierarchical-inheritable model binning concept was applied to the particular foundry process design kit previously mentioned, the total number of parameter values/expressions reduced from approximately 8400 to 2100 per device, e.g., a compression factor of four was achieved. Higher compression rates are expected to be found in additional foundry process design kits, especially those with even more finely grained binning Selection of Hierarchy Dimensions In the example described above, the base device model was first extended by length. However, any dimension may be chosen for model extension, in any order. Further, in the examples shown in this description, the dimensions refer to geometric device specifications, but any descriptive model factor may be considered to be within the scope of the invention embodiments. In some instances, greater compression may be achieved by for example extending the base model by width first, as shown below.

FIG. 4A shows another model hierarchy 400, with width-dependent parameters as the middle level, according to an embodiment. In this case, the intermediate level of hierarchy (pch_width) specifies two width-based model groups that extend (e.g., inherit from or subclass) the base model. The leaf-level pch model group extends (e.g., inherits from or subclasses) the pch_width model. This example is effectively the transpose of the FIG. 3A example.

Figure 4B:
FIG. 4B summarizes the model hierarchy in text form, FIG. 4C summarizes the model hierarchy in graphical form.
Figure 4C:
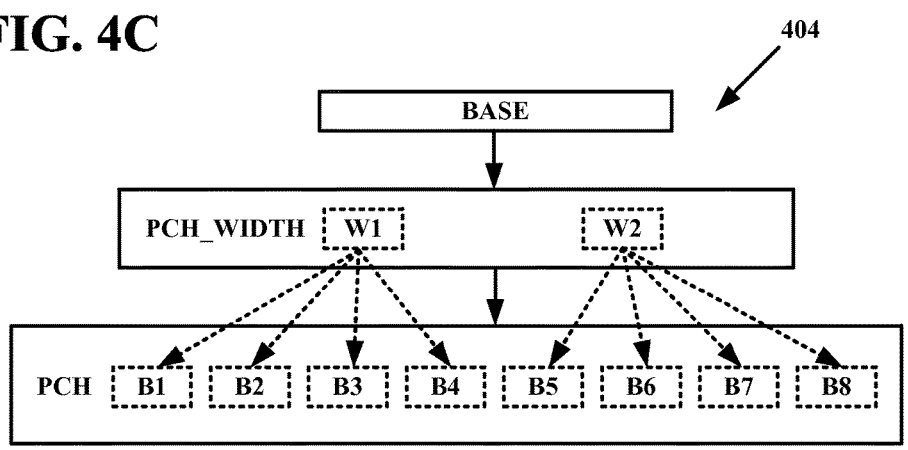
FIG. 4A is a diagram of another model hierarchy, with width-dependent parameters as the middle level, according to an embodiment.
FIG. 4D is a diagram of geometry-related partitions resulting from the model hierarchy.
Figure 4D:
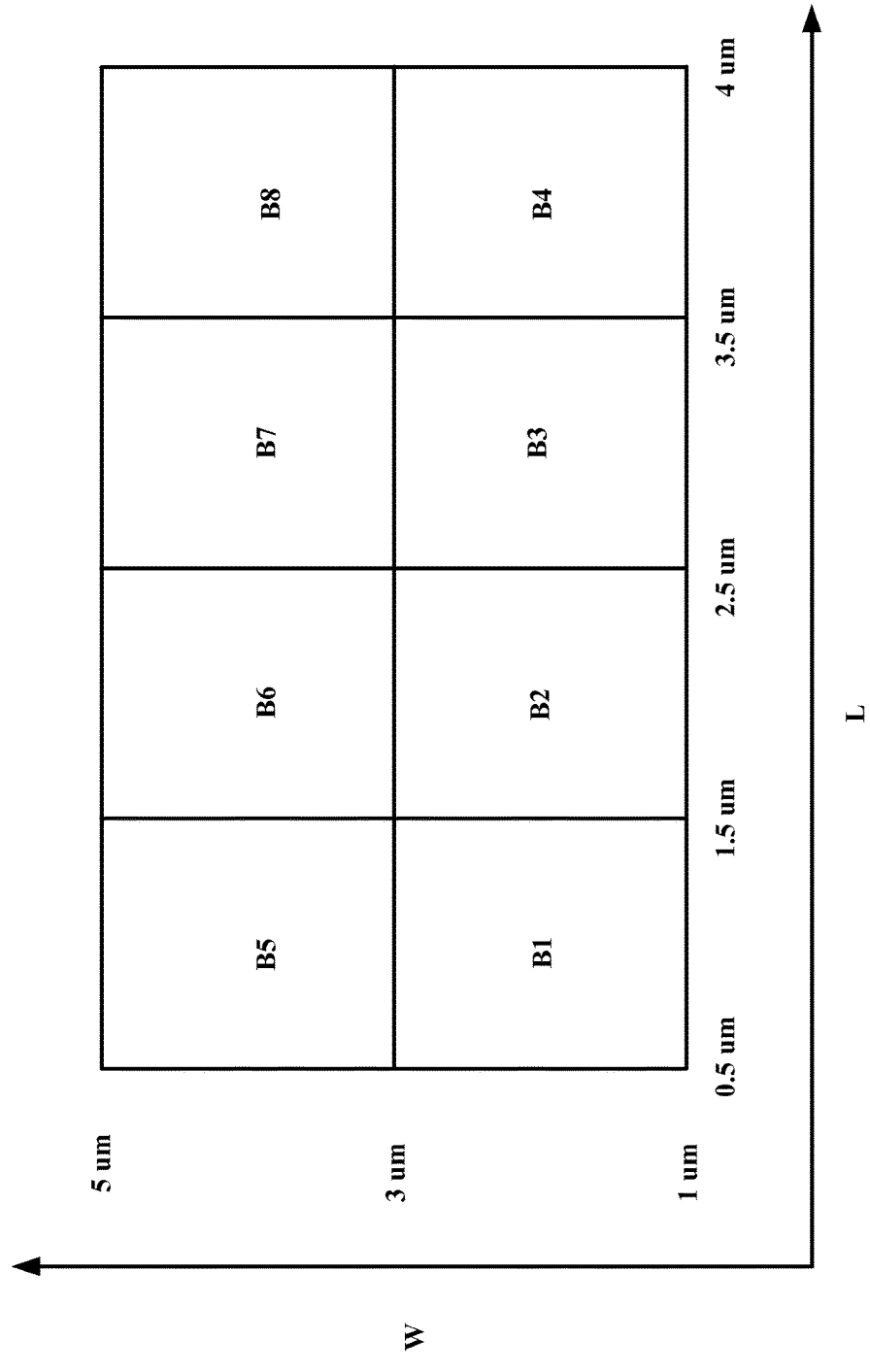

FIG. 4B summarizes the model hierarchy 402 in text form, while FIG. 4C summarizes the model hierarchy 404 in graphical form, according to this embodiment. Model inheritance is again shown via solid lines, and model bin inheritance is again shown via dashed lines. FIG. 4D is a diagram of geometry-related partitions 406 resulting from the model hierarchy, according to this embodiment.

Bin Name Uniqueness Across the Inheritance Hierarchy

FIG. 5 shows an illegal redefinition of a bin across a model hierarchy 500, according to an embodiment. Bin names that are not unique across an inheritance hierarchy are not allowed in this embodiment as they cannot be uniquely resolved. It may thus be illegal to define a bin with the same name across hierarchical levels in this embodiment. Thus, if a bin l1 exists in an intermediate level such as pch_len as shown, then a bin l1 cannot also exist in the lowest level illegal1 that extends pch_len.

Skipping Inheritance Levels

FIG. 6A is a diagram of an additional model hierarchy 600 with indirect inheritance, according to an embodiment. In this embodiment, it is possible for a bin to extend or inherit from a bin in an ancestor level of a hierarchy that is not specified in its immediate parent. The bin being inherited from must exist in some ancestor model group however, for an inheritance relationship to be established, in this embodiment.

In this example, the pch model defines a bin g6 that extends the l1 bin in the inheritance hierarchy. However, the l1 bin does not exist in the direct supermodel (e.g., parent) of pch (e.g., pch_len2). The lookup process continues up to the next level of hierarchy, e.g., to the grandparent model group pch_len, which does define a bin l1. Note that bin p1 does directly inherit from superbin l3 in the pch_len supermodel group.

Figures 6B, 6C:
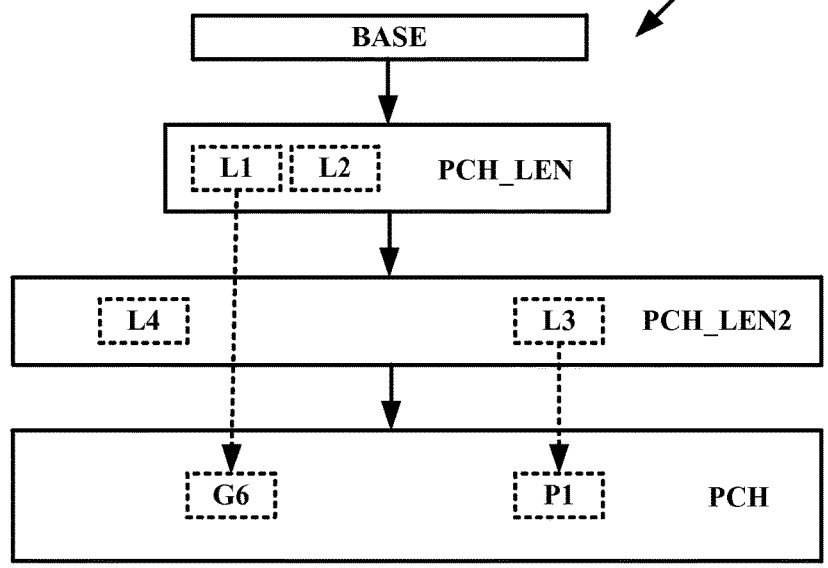
FIG. 6B summarizes the model hierarchy in text form, FIG. 6C summarizes the model hierarchy in graphical form.
Figure 6D:
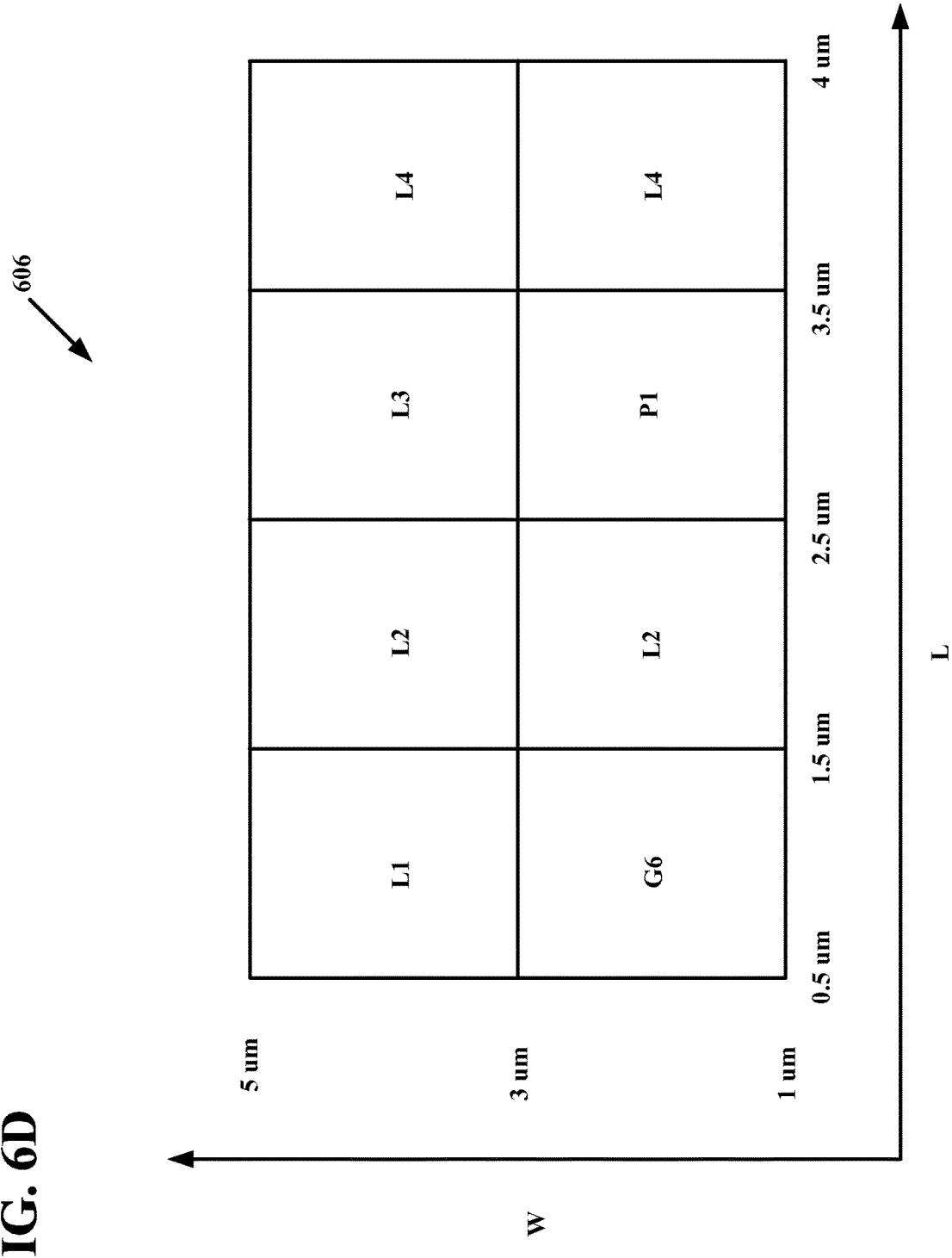
FIG. 6D is a diagram of geometry-related partitions resulting from the model hierarchy.

FIG. 6B summarizes the model hierarchy 602 in text form, FIG. 6C summarizes the model hierarchy 604 in graphical form, and FIG. 6D is a diagram of geometry-related partitions 606 resulting from the model hierarchy, according to this embodiment. Model inheritance is again shown via solid lines, and model bin inheritance is again shown via dashed lines.

Model Bin Inheritance is Optional

FIG. 7A is a diagram of a further model hierarchy 700 with optional inheritance, according to an embodiment. This model hierarchy demonstrates that it is possible to easily effectively "merge" two or more bins of a supermodel group by defining model bins that do not inherit superbin values. The optional inheritance syntax variation described in this extended model group enables creation of submodel bins having larger widths and/or lengths than might have been originally specified in the supermodels of a process design kit.

This embodiment defines bins c1, c2, c3, and c4 that are based on extending a base model or a next level of a hierarchy as has been previously demonstrated. However, FIG. 7A also defines bins c5 and c6 that effectively span two length columns. For these bins, all the parameters (not including the base parameters) are simply explicitly listed, along with their length and width range parameters (e.g., any of the four geometry range parameters lmin, lmax, wmin, and wmax).

Bin pch_merged.c5 is thus constructed to forego inheritance to directly combine two length ranges. The explicitly specified pch_merged.c5 lmin is specified as the minimum lmin value of l3 and l4 (e.g., 2.5 um) and the explicitly specified pch_merged.c5 lmax is specified as the maximum lmax value of l3 and l4 (e.g., 4 um). This model group formulation explicitly specifies all of the non-base parameters, which in this case include those width-independent parameters that are constant over length (e.g., pl1 . . . pln). A second model group bin pch_merged.c6 is constructed in a similar manner.

Figures 7B, 7C:
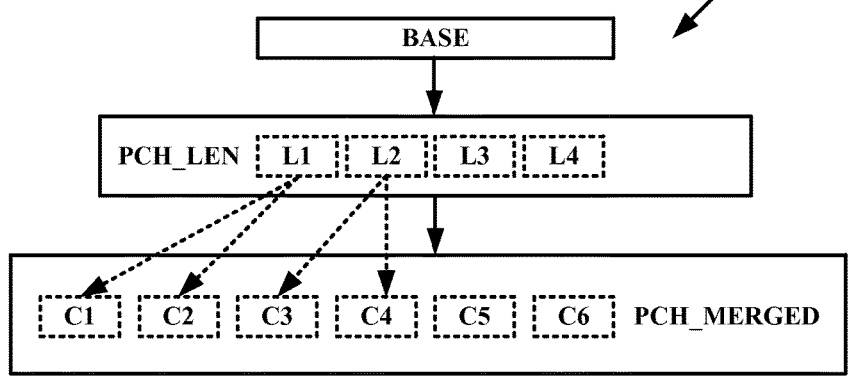
FIG. 7B summarizes the model hierarchy in text form, FIG. 7C summarizes the model hierarchy in graphical form.
Figure 7D:
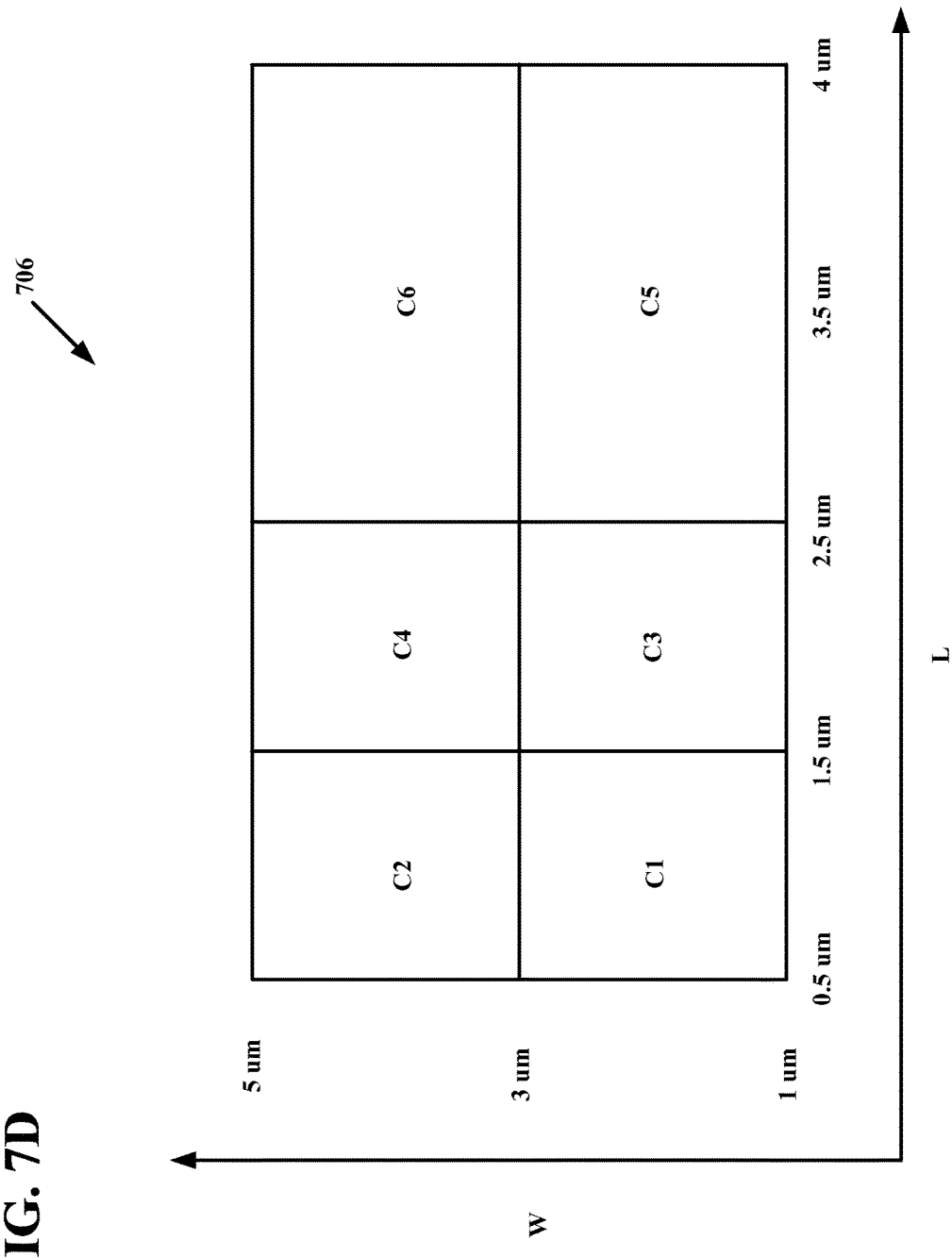
FIG. 7D is a diagram of geometry-related partitions resulting from the model hierarchy.

FIG. 7B summarizes the model hierarchy 702 in text form, FIG. 7C summarizes the model hierarchy 704 in graphical form, and FIG. 7D is a diagram of geometry-related partitions 706 resulting from the model hierarchy, according to this embodiment. Model inheritance is again shown via solid lines, and model bin inheritance is again shown via dashed lines.

Figure 2:
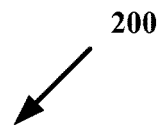
FIG. 2 is a diagram of a MOS model group.
Figure 8:
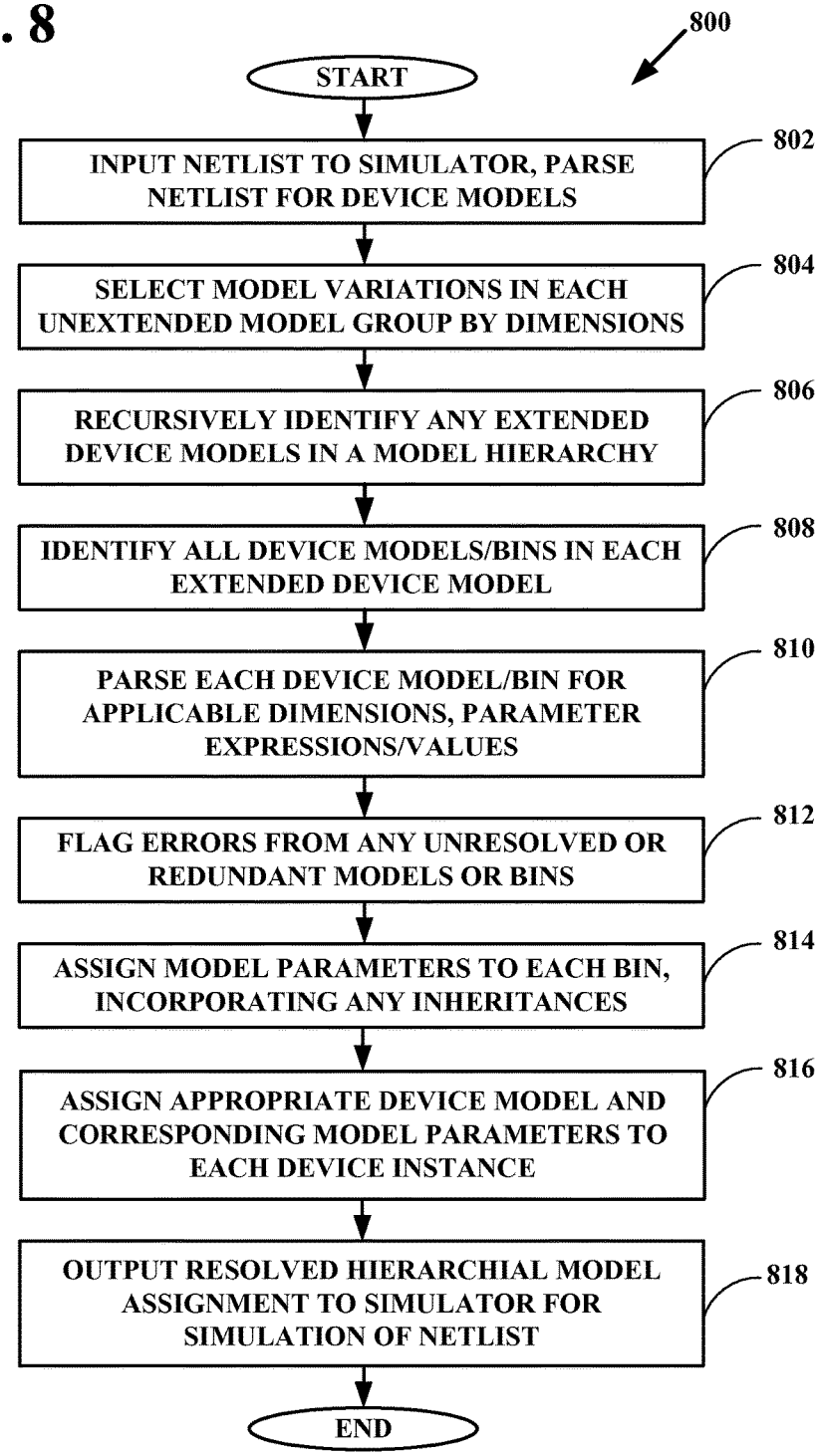
FIG. 8 is a flowchart of a model binning method, according to an embodiment.

FIG. 8 shows a flowchart of a model binning method 800, according to an embodiment. At 802, the method may input a netlist describing a circuit design to a simulator, which may then parse the netlist for device models. The parsing may include conventional methods used for existing simulators as well as the additional syntax and semantics described herein. A physical design kit may be input instead of a netlist. At 804, the simulator may select model variations in each unextended model group (for example as shown in FIG. 2) using an automatic model selection feature. Model selections are typically made according to device length and width values in conventional simulators, though the embodiments of the invention are not so limited.

At 806, the method may recursively identify any device models in the netlist that are extensions of other device models, so that any model hierarchy enabled by embodiments of the present invention is found and processed as described. At 808, the method may identify all device model bins in each identified extended device model. A base model may have no bins, while other model group extensions may have numerous bins as described. At 810, the method may parse each device model extension bin for its applicable dimension values. This process may be similar to the automatic model selection feature used for unextended model groups in some conventional simulators, but now may extend across an entire model hierarchy. That is, while a conventional simulator may select model variations by number or by length and width values, embodiments of the present invention may determine the selection values for each leaf-level model through direct or indirect inheritance, or by direct specification without relying on inheritance.

At 812, the method may flag errors arising from various problems relating to a model hierarchy. For example, if bin names or model names cannot be uniquely resolved, or if a model is not clearly defined as being an extension (for example, with an inheritance keyword), a warning or error may be outputted to alert the user. At 814, the method may assign model parameter values to each bin, incorporating any inheritances that may determine model parameter values from a model hierarchy. At 816, the appropriate device model and its corresponding model parameters may be assigned to each device instance arising from the netlist, via a union of the model and bin parameters. At 818, the method may output the fully resolved hierarchical device model assignment to the simulator, which may proceed with simulation of the netlist using the assigned device models and corresponding model parameters. The device model assignment may also be output for use as a condensed process design kit that may be read into future netlists.

Figure 9:
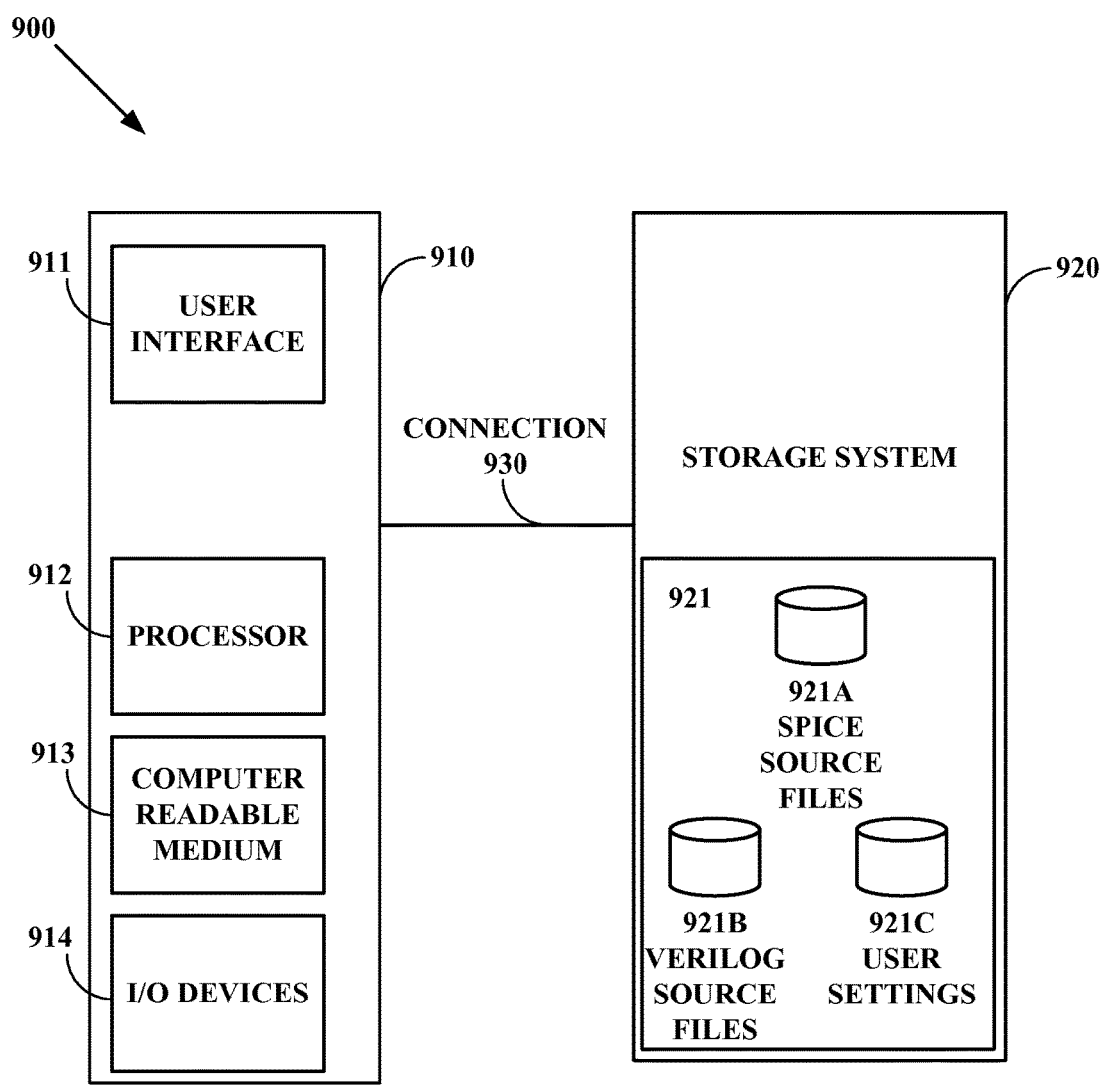
FIG. 9 is a block diagram of a circuit analysis system, according to an embodiment.

FIG. 9 shows a block diagram of an exemplary circuit analysis system 900, according to an embodiment. This system may provide simulator functionality for any of the methods described above. A user may access the system 900 through a standalone client system, client-server environment, or a network environment. System 900 may comprise one or more clients or servers 910, one or more storage systems 920, and a connection or connections 930 between and among these elements.

Client 910 may execute instructions stored on transitory or non-transitory computer readable medium 913 with processor 912, and may provide a user interface 911 to allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a GUI run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media.

Databases 921 may be stored in storage system 920 such that they may be persistent, retrieved, or edited by the user. Databases 921 may include SPICE source files 921A, Verilog source files 921B, and a user input database 921C for example. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
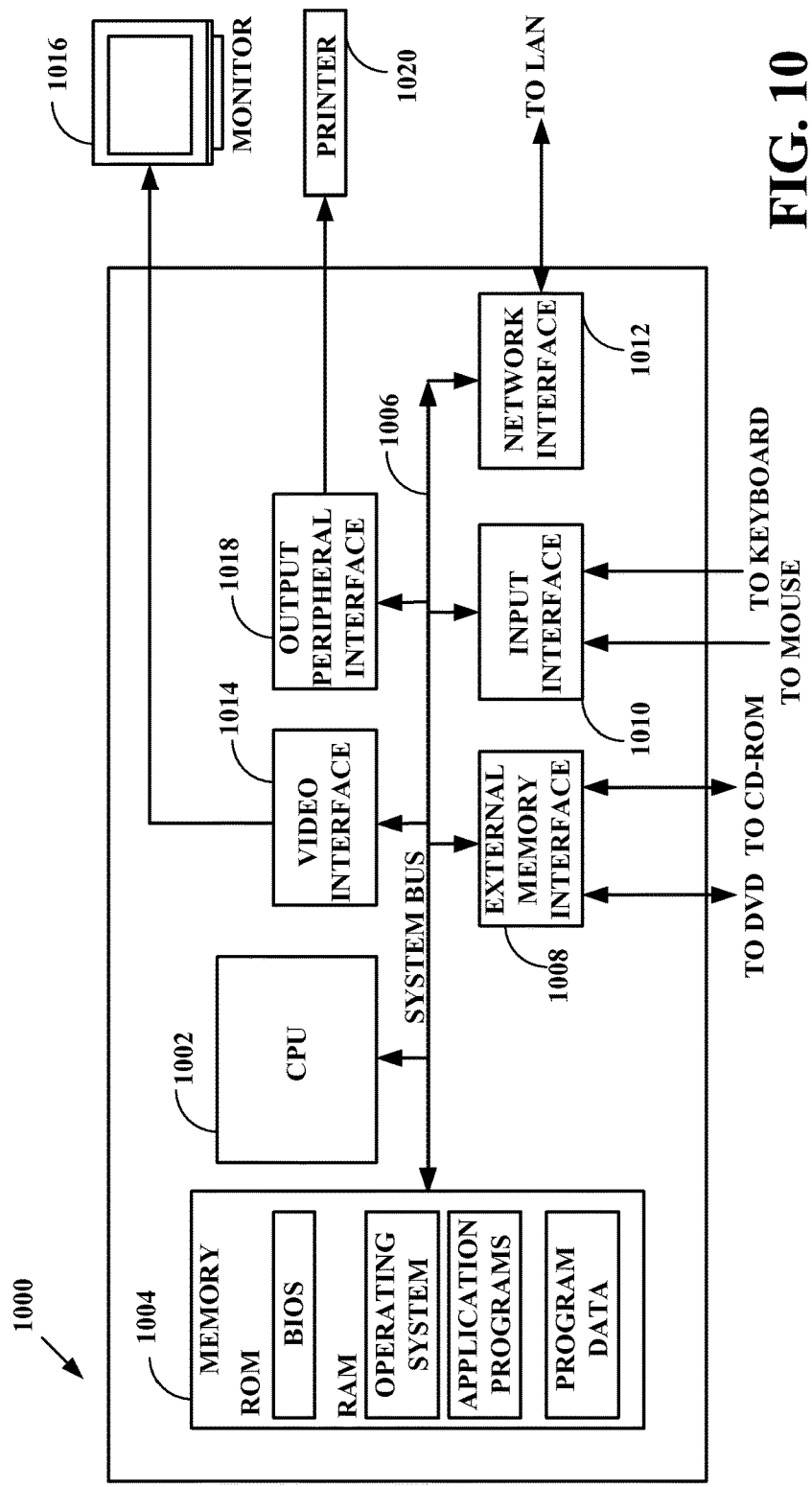
FIG. 10 is a diagram of a computer system, according to an embodiment.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit design tasks, along with software products commercially available for performing computer-aided integrated circuit design tasks. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention will be apparent to ordinarily skilled artisans. The invention is limited only by the scope of the appended claims.

What is claimed is:

1. A computer-implemented method for assigning hierarchically specified device models to device instances during model selection for a computer-implemented circuit simulator, comprising:
   using a computer:
   parsing an input file describing a circuit design, wherein the parsing includes identifying (i) supermodels and submodels of a model inheritance hierarchy in the input file and (ii) superbins and subbins of a bin inheritance hierarchy in the model inheritance hierarchy;
   constructing a hierarchically specified device model for each device instance based on the parsing, wherein the hierarchically specified device model includes the model inheritance hierarchy and the corresponding bin inheritance hierarchy, wherein one of the supermodels is a base model and includes no corresponding bins, wherein the base model defines at least one parameter value common to all of the superbins and subbins;
   wherein, for each device instance:
      selecting its corresponding bin from the bin inheritance hierarchy according to at least one instance dimension value;
      determining a first set of parameter values from the bin inheritance hierarchy, wherein inherited parameters in the first set of parameter values are defined in at least one higher bin level in the bin inheritance hierarchy;
      determining a second set of parameter values from the model inheritance hierarchy, wherein at least one parameter of the second set of parameter values is directly specified; and
      assigning a device model comprising a union of the first set of parameter values with the second set of parameter values;
   outputting the device model assignments; and
   simulating, with the computer-implemented circuit simulator, the circuit design based on the outputted device model assignments.

2. The method of claim 1 wherein the input file is one of (i) a netlist and (ii) a process design kit.

3. The method of claim 1 wherein the identifying supermodels and submodels comprises detecting a supermodel name in a model statement.

4. The method of claim 1 wherein the identifying superbins and subbins comprises detecting a superbin name in a bin statement.

5. The method of claim 1 wherein the identifying subbins comprises resolving any specified unique model bin names.

6. The method of claim 1 wherein the instance dimension value comprises at least one of a minimum length, a minimum width, a maximum length, and a maximum width.

7. The method of claim 1 wherein inherited parameters in the second set of parameter values are defined in at least one higher model in the model inheritance hierarchy.

8. A non-transitory computer readable medium storing instructions that, when executed by a processor, perform a method for assigning hierarchically specified device models to device instances during model selection for a computer-implemented circuit simulator, the method comprising:
   parsing an input file describing a circuit design, wherein the parsing includes identifying (i) supermodels and submodels of a model inheritance hierarchy in the input file and (ii) superbins and subbins of a bin inheritance hierarchy in the model inheritance hierarchy;
   constructing a hierarchically specified device model for each device instance based on the parsing, wherein the hierarchically specified device model includes the model inheritance hierarchy and the corresponding bin inheritance hierarchy, wherein one of the supermodels is a base model and includes no corresponding bins, wherein the base model defines at least one parameter value common to all of the superbins and subbins;
   wherein, for each device instance:
      selecting its corresponding bin from the bin inheritance hierarchy according to at least one instance dimension value;
      determining a first set of parameter values from the bin inheritance hierarchy, wherein inherited parameters in the first set of parameter values are defined in at least one higher bin level in the bin inheritance hierarchy;

determining a second set of parameter values from the model inheritance hierarchy, wherein at least one parameter of the second set of parameter values is directly specified; and assigning a device model comprising a union of the first set of parameter values with the second set of parameter values;

outputting the device model assignments; and simulating, with the computer-implemented circuit simulator, the circuit design based on the outputted device model assignments.

9. The medium of claim 8 wherein the identifying supermodels and submodels comprises detecting a supermodel name in a model statement.

10. The medium of claim 8 wherein the identifying superbins and subbins comprises detecting a superbin name in a bin statement.

11. The medium of claim 8 wherein the identifying subbins comprises resolving any specified unique model bin names.

12. The medium of claim 8 wherein the instance dimension value comprises at least one of a minimum length, a minimum width, a maximum length, and a maximum width.

13. The medium of claim 8 wherein inherited parameters in the second set of parameter values are defined in at least one higher model in the model inheritance hierarchy.

14. The medium of claim 8 wherein detected model errors trigger an error alert.

15. A system comprising:

a non-transitory memory storing executable instructions; and a processor executing the instructions to perform a method for assigning hierarchically specified device models to device instances during model selection for a computer-implemented circuit simulator, the method comprising:

parsing an input file describing a circuit design, wherein the parsing includes identifying (i) supermodels and submodels of a model inheritance hierarchy in the input file and (ii) superbins and subbins of a bin inheritance hierarchy in the model inheritance hierarchy;

constructing a hierarchically specified device model for each device instance based on the parsing, wherein the hierarchically specified device model includes the model inheritance hierarchy and the corresponding bin inheritance hierarchy, wherein one of the supermodels is a base model and includes no corresponding bins, wherein the base model defines at least one parameter value common to all of the superbins and subbins;

wherein, for each device instance:

selecting its corresponding bin from the bin inheritance hierarchy according to at least one instance dimension value;

determining a first set of parameter values from the bin inheritance hierarchy, wherein inherited parameters in the first set of parameter values are defined in at least one higher bin level in the bin inheritance hierarchy;

determining a second set of parameter values from the model inheritance hierarchy, wherein at least one parameter of the second set of parameter values is directly specified; and assigning a device model comprising a union of the first set of parameter values with the second set of parameter values;

outputting the device model assignments; and simulating, with the computer-implemented circuit simulator, the circuit design based on the outputted device model assignments.

16. The system of claim 15 wherein the identifying supermodels and submodels comprises detecting a supermodel name in a model statement.

17. The system of claim 15 wherein the identifying superbins and subbins comprises detecting a superbin name in a bin statement.

18. The system of claim 15 wherein the identifying subbins comprises resolving any specified unique model bin names.

19. The system of claim 15 wherein the instance dimension value comprises at least one of a minimum length, a minimum width, a maximum length, and a maximum width.

20. The system of claim 15 wherein inherited parameters in the second set of parameter values are defined in at least one higher model in the model inheritance hierarchy.

* * * * *